(12) United States Patent
Kawaguchi et al.

(10) Patent No.: US 9,006,581 B2
(45) Date of Patent: Apr. 14, 2015

(54) PRINTED WIRING BOARD AND METHOD OF MANUFACTURE THEREOF

(75) Inventors: Toshiyuki Kawaguchi, Saitama (JP); Kazutoki Tahara, Saitama (JP); Tsutomu Saga, Saitama (JP); Hiroyuki Yasuda, Saitama (JP)

(73) Assignee: Shin-Etsu Polymer Co., Ltd. (JP)

(*) Notice: Subject to any disclaimer, the term of this patent is extended or adjusted under 35 U.S.C. 154(b) by 322 days.

(21) Appl. No.: 13/639,640

(22) PCT Filed: Apr. 11, 2011

(86) PCT No.: PCT/JP2011/059001
§ 371 (c)(1),
(2), (4) Date: Dec. 19, 2012

(87) PCT Pub. No.: WO2011/129299
PCT Pub. Date: Oct. 20, 2011

(65) Prior Publication Data
US 2013/0092428 A1    Apr. 18, 2013

(30) Foreign Application Priority Data

Apr. 15, 2010    (JP) .................................. 2010-094028

(51) Int. Cl.
*H05K 1/03* (2006.01)
*H05K 1/00* (2006.01)
(Continued)

(52) U.S. Cl.
CPC ............ *H05K 1/0218* (2013.01); *H05K 1/0234* (2013.01); *H05K 1/0242* (2013.01);
(Continued)

(58) Field of Classification Search
USPC ........... 174/250, 255, 257, 350; 361/816, 818
See application file for complete search history.

(56) References Cited

U.S. PATENT DOCUMENTS 4,647,714 A * 3/1987 Goto ................................ 174/36
5,028,743 A    7/1991 Kawakami et al. ............ 174/264
(Continued)

FOREIGN PATENT DOCUMENTS

CN    101489346 A    7/2009
JP    01-305596        12/1989
(Continued)

OTHER PUBLICATIONS

International Search Report and Written Opinion mailed Jun. 7, 2011 in corresponding PCT International Application No. PCT/JP2011/059001.

(Continued)

*Primary Examiner* — Timothy Thompson
*Assistant Examiner* — Sherman Ng
(74) *Attorney, Agent, or Firm* — Ostrolenk Faber LLP

(57) ABSTRACT

A printed wiring board, including a printed wiring member which respectively has object conductor that is subjected to electromagnetic wave shielding on at least one surface of an insulating layer; and an electromagnetic wave shielding member which has an electromagnetic wave shielding layer composed of a low-resistance section and a high-resistance section on at least one surface of a base film. The printed wiring member and the electromagnetic wave shielding member are bonded together with interposition of insulating adhesive layers, and with arrangement of the electromagnetic wave shielding layer separately and in opposition so that the object conductor is covered. The electromagnetic wave shielding layer and the object conductor are composed of the same type of conductive material, and the electromagnetic wave shielding layer is not exposed at the circumferential end faces of the printed wiring board.

7 Claims, 3 Drawing Sheets

(51) Int. Cl.
  *H05K 1/09* (2006.01)
  *H05K 9/00* (2006.01)
  *H05K 1/02* (2006.01)

(52) U.S. Cl.
  CPC ...... *H05K1/0393* (2013.01); *H05K 2201/0133* (2013.01); *H05K 2201/0715* (2013.01); *H05K 2201/09736* (2013.01)

(56) References Cited

U.S. PATENT DOCUMENTS

| | | | | |
|---|---|---|---|---|
| 5,220,135 A | * | 6/1993 | Kawakami et al. | 174/264 |
| 5,270,493 A | * | 12/1993 | Inoue et al. | 174/253 |
| 5,294,755 A | * | 3/1994 | Kawakami et al. | 174/264 |
| 5,416,667 A | * | 5/1995 | Ichikawa et al. | 361/816 |
| 2008/0049410 A1 | * | 2/2008 | Kawaguchi et al. | 361/818 |

FOREIGN PATENT DOCUMENTS

| | | |
|---|---|---|
| JP | 2-033999 | 2/1990 |
| JP | 02-139993 | 5/1990 |
| JP | 2-249291 | 10/1990 |
| JP | 2000-269632 | 9/2000 |
| JP | 2006-156946 | 6/2006 |
| JP | 2009-283901 | 12/2009 |

OTHER PUBLICATIONS

Chinese Office Action, dated Dec. 11, 2014, issued in corresponding Chinese Patent Application No. 201180019224.1. English Translation of Search Report. Total 7 pages.

* cited by examiner

PRINTED WIRING BOARD AND METHOD OF MANUFACTURE THEREOF

CROSS-REFERENCE TO RELATED APPLICATIONS

The present application is a 35 U.S.C. §§371 national phase conversion of PCT/JP2011/059001, filed Apr. 11, 2011, which claims priority of Japanese Patent Application No. 2010-094028, filed Apr. 15, 2010, the contents of which are incorporated herein by reference. The PCT International Application was published in the Japanese language.

TECHNICAL FIELD

The present invention relates to a printed wiring board with an electromagnetic wave shielding function, and to its method of manufacture.

BACKGROUND ART

As electromagnetic wave noise generated from printed wiring boards, electronic parts and the like may affect other electric circuitry and electronic parts, and may cause malfunctions and the like, it is necessary to shield out electromagnetic wave noise. Consequently, printed wiring boards are being provided with an electromagnetic wave shielding function.

In conjunction with the miniaturization and multifunctionalization of electronic equipment equipped with printed wiring boards, the allowable space in printed wiring boards has been narrowing. Consequently, there is demand for reduced thickness in printed wiring boards, and also for reduced bending radius in flexible printed wiring boards. There is also demand for achievement of wiring functions without loss of reliability of the electromagnetic wave shielding function even in a variety of usage environments.

As a printed wiring board with an electromagnetic wave shielding function, for example, the following has been proposed.

(1) A flexible printed wiring board wherein an undercoat layer, a shielding layer coated with a conductive paste containing a metal powder, and an overcoat layer are sequentially provided on a copper foil wiring circuit with a heat-resistant plastic film surface, and wherein the shielding layer and the ground pattern of the copper foil wiring circuit are electrically connected through the undercoat layer at appropriate interval (Patent Document 1).

(2) A flexible printed wiring board wherein an electromagnetic wave shielding film—in which a metal thin-film layer and a conductive adhesive layer containing a metal filler are sequentially provided on one surface of a coverlay film—is mounted on a base film, on which an insulating layer that imparts insulation excluding a portion of a ground circuit among the printed circuits is provided, so that the conductive adhesive layer adheres to the insulating layer and a portion of the ground circuit (Patent Document 2).

However, the flexible printed wiring board of (1) has the following problems.

(i) The shielding layer containing the metal powder is fragile due to numerous interfaces between heterogeneous materials, and lacks sufficient strength against repeated bending of the flexible wiring board.

(ii) The undercoat layer is required in order to maintain insulation between the shielding layer and the copper foil wiring circuit excluding a portion of the ground pattern, thickening the flexible printed wiring board.

(iii) It is necessary to form a through hole in part of the undercoat layer in order to electrically connect the shielding layer and a portion of the ground pattern, and the processing of the through hole requires time and labor.

(iv) As the shielding layer is exposed at the circumferential end faces of the flexible printed wiring board, corrosion occurs due to infiltration of moisture and contact with oxygen, increasing the resistance values, and attenuating the electromagnetic wave shielding function. Therefore, the reliability of the electromagnetic wave shielding function is poor.

(v) As the shielding layer is composed of curing resin obtained by curing the conductive paste, the shielding layer cannot be etched into a desired shape using etching liquid.

In addition, the flexible printed wiring board of (2) has the following problems.

(i) The conductive adhesive layer containing the metal filler is fragile due to numerous interfaces between heterogeneous materials, and lacks sufficient strength against repeated bending of the flexible wiring board.

(ii) An undercoat layer is required in order to maintain insulation between the conductive adhesive layer and the printed circuits excluding a portion of the ground circuit, thickening the flexible printed wiring board.

(iii) It is necessary to form a through hole in part of the insulating layer in order to electrically connect the conductive adhesive layer and a portion of the ground circuit, and take a lot of trouble with the working of the through hole.

(iv) As the metal thin-film layer is exposed at the circumferential end faces of the flexible printed wiring board, corrosion occurs due to infiltration of moisture and contact with oxygen, increasing the resistance values, and attenuating the electromagnetic wave shielding function. Therefore, the reliability of the electromagnetic wave shielding function is poor.

(v) As the material of the metal (silver) thin-film layer and the material of the printed circuits (copper) are different, etching cannot be conducted with the same etching liquid. Consequently, the etching equipment and etching liquid must be respectively prepared for etching of the metal thin-film layer and etching of the printed circuits.

PRIOR ART REFERENCES

Patent Documents

Patent Document 1: Japanese Unexamined Patent Application, First Publication No. H2-33999
Patent Document 2: Japanese Unexamined Patent Application, First Publication No. 2000-269632

DISCLOSURE OF THE INVENTION

Problems to be Solved by the Invention

The present invention was made in light of the foregoing circumstances. It offers a printed wiring board which has a highly reliable electromagnetic wave shielding function even without connecting an electromagnetic wave shielding layer to a ground, which has excellent flexural properties in a flexible printed wiring board, which enables reduced thickness, and which allows etching of the electromagnetic wave shielding layer and the conductors with the same etching liquid during manufacture, and a method of manufacture thereof.

Means for Solving the Problems

A first aspect of the present invention is a printed wiring board, including: a printed wiring member which respectively has an object conductor that is subjected to electromagnetic wave shielding on at least one surface of an insulating layer; and an electromagnetic wave shielding member which has an electromagnetic wave shielding layer composed of a low-resistance section and a high-resistance section on at least one surface of a base film; wherein the printed wiring member and the electromagnetic wave shielding member are bonded together with interposition of an insulating adhesive layer, and with arrangement of the electromagnetic wave shielding layer separately and in opposition so that the object conductor is covered; the electromagnetic wave shielding layer and the object conductor are composed of the same type of conductive material; and the electromagnetic wave shielding layer is not exposed at the circumferential end faces of the printed wiring board.

A second aspect of the present invention is the printed wiring board pertaining to the first aspect, wherein the electromagnetic wave shielding layer is separated from a via hole or through hole of the printed wiring board.

A third aspect of the present invention is the printed wiring board pertaining to the first or second aspects, wherein a surface resistance of the low-resistance section is from 0.01 to 5Ω, and a surface resistance of the high-resistance section is from 2 to 100 times of the surface resistance of the low-resistance section.

A fourth aspect of the present invention is the printed wiring board pertaining to any one of the first to third aspects, wherein the high-resistance section is repeatedly formed at intervals.

A fifth aspect of the present invention is the printed wiring board pertaining to any one of the first to fourth aspects, wherein the base film has a soft material section that is formed on parts of at least one surface of the base film and that is softer than the surface of the base film; the electromagnetic wave shielding layer is a vapor deposition film composed of the conductive material formed on a surface of the base film on the side where the soft material section is formed; a vapor deposition film formed on the surface of the base film constitutes the low-resistance section; and a vapor deposition film formed on the surface of the soft material section constitutes the high-resistance section.

A sixth aspect of the present invention is the printed wiring board pertaining to any one of the first to fourth aspects, wherein the base film has a textured section and a non-textured section excluding the textured section which is formed on parts of at least one surface of the base film; the electromagnetic wave shielding layer is a vapor deposition film composed of the conductive material formed on the surface of the base film on the side where the textured section is formed; and a vapor deposition film formed on the non-textured section constitutes the low-resistance section, while a vapor deposition film formed on the textured section constitutes the high-resistance section.

A seventh aspect of the present invention is a method of manufacture of the printed wiring board pertaining to any one of the first to sixth aspects, which has the following steps (I)-(III).

(I) A step in which the conductor of the printed wiring member is etched to desired shapes using etching liquid.

(II) A step in which, using the same etching liquid as the step (I), the electromagnetic wave shielding layer of the electromagnetic wave shielding member is etched to a desired shape, and to a size where the electromagnetic wave shielding layer is not exposed at the circumferential end faces of the printed wiring board in the printed wiring board obtained in the following step (III).

(III) A step in which trimming of the external form is conducted, after the printed wiring members and the electromagnetic wave shielding member are bonded together with interposition of the insulating adhesive layer and with arrangement of the electromagnetic wave shielding layer in opposition so as to cover the object conductor.

Effects of the Invention

The printed wiring board of the present invention has a highly reliable electromagnetic wave shielding function even without connecting the electromagnetic wave shielding layer to a ground, has excellent flexural properties in a flexible printed wiring board, enables reduced thickness, and allows etching of the electromagnetic wave shielding layer and the conductor with the same etching liquid during manufacture.

According to the method of manufacture of the printed wiring board of the present invention, it is possible to manufacture the printed wiring board which has a highly reliable electromagnetic wave shielding function even without connecting the electromagnetic wave shielding layer to the ground, which has excellent flexural properties in the flexible printed wiring board, and which enables reduced thickness, and it is possible to use the same etching liquid when etching the electromagnetic wave shielding layer and the conductor.

BEST MODE FOR CARRYING OUT THE INVENTION

Printed Wiring Board

Figure 1:
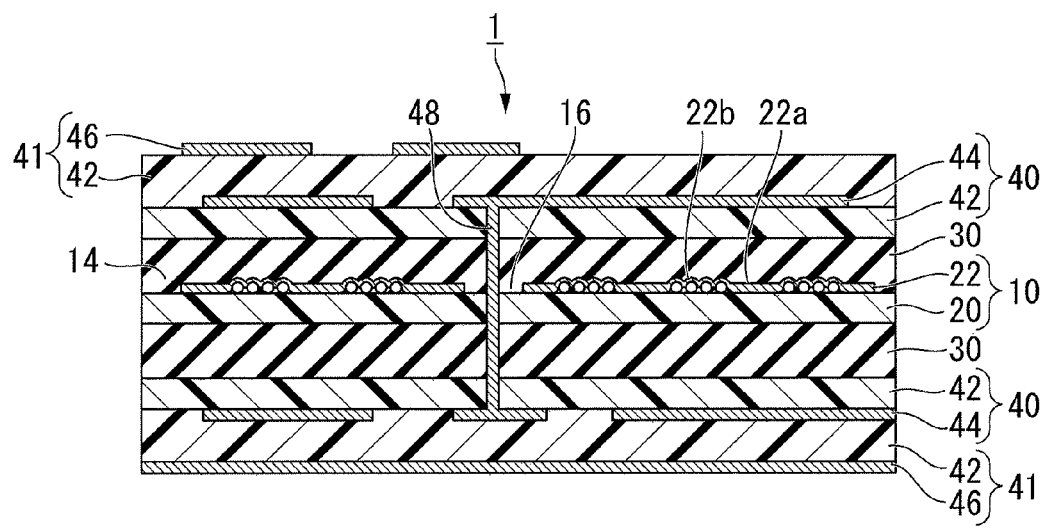
FIG. 1 is a cross-sectional view which shows an example of a printed wiring board of the present invention.

FIG. 1 is a cross-sectional view which shows an example of the printed wiring board of the present invention.

A printed wiring board 1 is provided with an electromagnetic wave shielding member 10, which has an electromagnetic wave shielding layer 22 composed of a low-resistance section 22a and a high-resistance section 22b on one surface of a base film 20; printed wiring member 40, which respectively have object conductor 44 that is subjected to electromagnetic wave shielding on one surface of an insulating layer 42, and which adhere to both surfaces of the electromagnetic wave shielding member 10 with interposition of an insulating adhesive layer 30; and also a printed wiring member 41 which is provided on these surfaces, and which respectively have one or more conductor 46 on one surface of the insulating layer 42.

In the printed wiring board 1, the electromagnetic wave shielding layer 22 is arranged separately and in opposition with interposition of the insulating adhesive layer 30 so as to cover the object conductor 44.

The electromagnetic wave shielding layer 22 is not formed at a circumferential edge 14 of the electromagnetic wave shielding member 10, with the result that the electromagnetic wave shielding layer 22 is not exposed at the circumferential end face of the printed wiring board 1.

Moreover, the electromagnetic wave shielding layer 22 is also not formed at a periphery 16 of a via hole 48, with the result that the electromagnetic wave shielding layer 22 is separated from the via hole 48.

Figure 2:
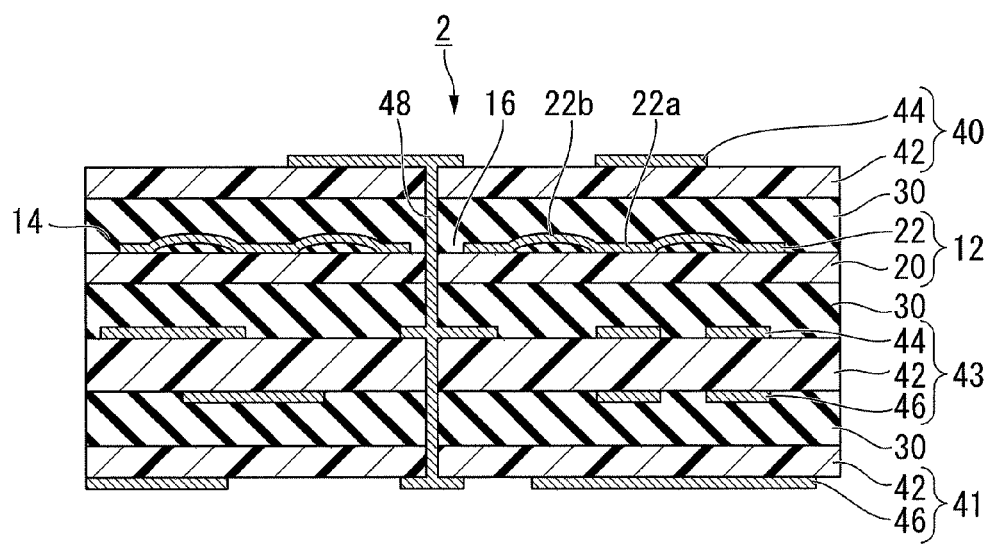
FIG. 2 is a cross-sectional view which shows another example of a printed wiring board of the present invention.

FIG. 2 is a cross-sectional view which shows another example of a printed wiring board of the present invention.

A printed wiring board 2 is provided with an electromagnetic wave shielding member 12 which has the electromagnetic wave shielding layer 22 composed of the low-resistance section 22a and the high-resistance section 22b on one surface of the base film 20; the printed wiring member 40 which has the object conductor 44 that is subjected to electromagnetic wave shielding on one surface of the insulating layer 42, and which is bonded to one surface of the electromagnetic wave shielding member 12 with interposition of the insulating adhesive layer 30; a printed wiring member 43, which has the object conductor 44 that is subjected to electromagnetic wave shielding on one surface of the insulating layer 42, which has the conductor 46 on the other surface of the insulating layer 42, and which is bonded to the other surface of the electromagnetic wave shielding member 12 with interposition of the insulating adhesive layer 30; and also a printed wiring member 41 which has the conductor 46 on one surface of the insulating layer 42, and which is bonded to the surface of the printed wiring member 43 with interposition of the insulating adhesive layer 30.

In the printed wiring board 2, the electromagnetic wave shielding layer 22 is arranged separately and in opposition with interposition of the insulating adhesive layer 30 so as to cover the object conductor 44.

The electromagnetic wave shielding layer 22 is not formed at the circumferential edge 14 of the electromagnetic wave shielding member 12, with the result that the electromagnetic wave shielding layer 22 is not exposed at the circumferential end face of the printed wiring board 2.

Moreover, the electromagnetic wave shielding layer 22 is also not formed at a periphery 16 of a via hole 48, with the result that the electromagnetic wave shielding layer 22 is separated from the via hole 48.

<Electromagnetic Wave Shielding Member>

As the electromagnetic wave shielding member, one may cite, for example, the following two types of members.

(α) An electromagnetic wave shielding film, wherein: the base film has the textured section formed on parts of at least one surface of the base film, and the non-textured section excluding the textured section; and the electromagnetic wave shielding layer is the vapor deposition film composed of the conductive material formed on the surface of the base film on the side where the textured section is formed.

(β) An electromagnetic wave shielding film, wherein: the base film has the soft material section that is formed on parts of at least one surface of the base film, and that is softer than the surface of the base film; and the electromagnetic wave shielding layer is the vapor deposition film composed of the conductive material formed on the surface of the base film on the side where the soft material section is formed.

(Electromagnetic Wave Shielding Film (α))

Figure 3:
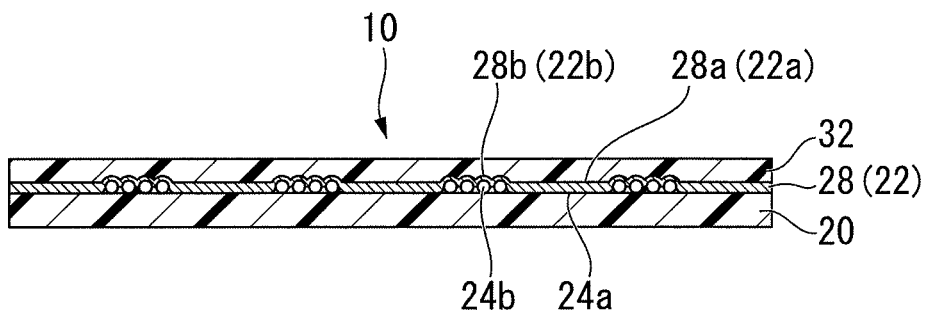
FIG. 3 is a cross-sectional view which shows an example of an electromagnetic wave shielding member used in the present invention.

FIG. 3 is a cross-sectional view which shows an example of the electromagnetic wave shielding film (α).

The electromagnetic wave shielding member 10 has: the base film 20 which has a printed section (a textured section 24b) formed by printing parts of one surface of the base film 20, and an unprinted section (a non-textured section 24a) excluding the printed section; a vapor deposition film 28 composed of the conductive material formed on the surface of the base film 20 on the side where the printed section is formed; and a protective layer 32 which protects the surface of the vapor deposition film 28.

The protective layer 32 is removed when the printed wiring member is bonded to the surface of the vapor deposition film 28 side with interposition of the insulating adhesive layer 30.

Figure 4:
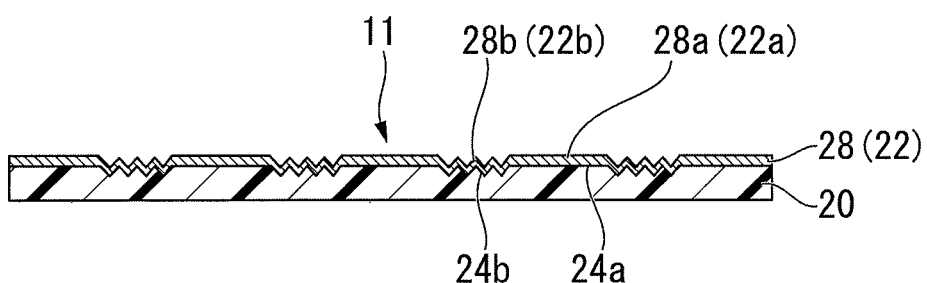
FIG. 4 is a cross-sectional view which shows another example of an electromagnetic wave shielding member used in the present invention.

FIG. 4 is a cross-sectional view which shows another example of the electromagnetic wave shielding film (α).

An electromagnetic wave shielding member 11 has: the base film 20 which has a roughened section (the textured section 24b) formed by roughening parts of one surface of the base film 20, and a non-roughened section (the non-textured section 24a) excluding the roughened section; and the vapor deposition film 28 (i.e., the electromagnetic wave shielding layer 22) which is composed of the conductive material and which is formed on the surface of the base film 20 on the side where the roughened section is formed.

In the electromagnetic wave shielding film (α), a vapor deposition film 28a formed on the non-textured section 24a constitute the low-resistance section 22a, and a vapor deposition film 28b formed on the textured section 24b constitute the high-resistance section 22b. That is, the surface resistance of the vapor deposition film 28 varies between the vapor deposition film 28a formed on the non-textured section 24a of the base film 20 and the vapor deposition film 28b formed on the textured section 24b of the base film 20. With respect to the textured section 24b of the base film 20, compared to the projected area viewed from above in a direction orthogonal to the surface of the base film 20, the area including the actual irregularities is wider. Consequently, in the case where the metal is physically deposited in the same vapor deposition amount, the vapor deposition film 28b formed on the textured section 24b of the base film 20 will be thinner than the vapor deposition film 28a formed on the non-textured section 24a. As a result, the surface resistance of the vapor deposition film 28b is greater than the surface resistance of the vapor deposition film 28a.

(Electromagnetic Wave Shielding Film ((β))

Figure 5:
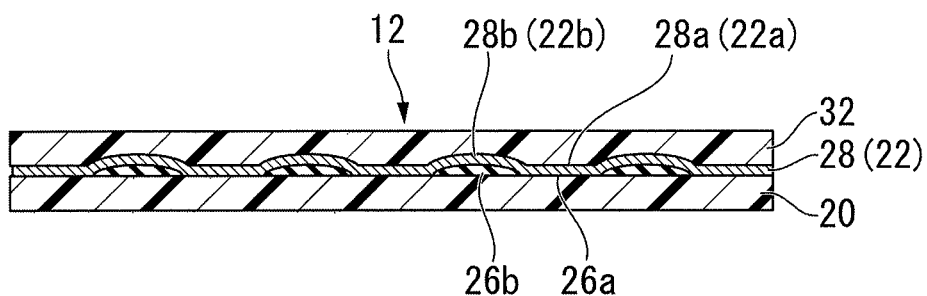
FIG. 5 is a cross-sectional view which shows yet another example of an electromagnetic wave shielding member used in the present invention.

FIG. 5 is a cross-sectional view which shows an example of the electromagnetic wave shielding film (β).

The electromagnetic wave shielding member 12 has: the base film 20 which has a soft material section 26b that is formed by printing parts of one surface of the base film 20 and that is softer than the surface of the base film 20, and the base film 20 which has a surface 26a of the base film 20 excluding the soft material section 26b; the vapor deposition film 28 (the electromagnetic wave shielding layer 22) composed of the conductive material formed on the surface of the base film 20 on the side where the soft material section 26b is formed; and the protective layer 32 which protects the surface of the vapor deposition film 28.

Furthermore, the protective layer 32 is removed when the printed wiring member is bonded to the surface of the vapor deposition film 28 side with interposition of the insulating adhesive layer 30.

In the electromagnetic wave shielding film (β), the vapor deposition film 28a formed on the surface 26a of the base film 20 constitutes the low-resistance section 22a, and the vapor deposition film 28b formed on the surface of the soft material section 26b constitutes the high-resistance section 22b. That is, the surface resistance of the vapor deposition film 28 varies between the vapor deposition film 28a formed on the surface 26a of the base film 20 and the vapor deposition film 28b formed on the soft material section 26b of the base film 20. When the metal is deposited onto the relatively hard surface 26a of the base film 20, first, islands are formed by condensation of multiple atoms, the islands gradually grow, and neighboring islands merge to constitute the continuous vapor deposition film 28a where surface resistance is low. On the other hand, when the metal is deposited onto the relatively soft surface of the soft material section 26b, the islands are somewhat embedded in the soft material, with the result that growth of the islands is inhibited, and voids form between islands to constitute the irregular vapor deposition film 28b where surface resistance is higher than that of the vapor deposition film 28a.

(Base Film)

The base film 20 is a film that constitutes the foundation when forming the textured section 24b or the soft material section 26b and the vapor deposition film 28.

Examples of the material of the base film 20 include a resin or a rubber elastic material. Examples of the resin include polyimide, liquid crystal polymer, polyaramide, polyphenylene sulfide, polyamide imide, polyether imide, polyethylene naphthalate, polyethylene terephthalate, and so on.

The hardness (Vickers hardness) of the surface of the base film 20 is preferably 400 or more from the standpoint of forming the vapor deposition film 28a that constitutes the low-resistance section 22a. The hardness (Vickers hardness) of the surface of the base film 20 is preferably 1200 or less from the standpoint of flexibility.

The surface resistance of the base film 20 is preferably $1 \times 10^6 \Omega$ or less.

The thickness of the base film 20 is preferably from 3 to 25 μm, from the standpoint of flexibility. When the base film 20 is thin, reinforcement such as a pressure-sensitive adhesive sheet having low adhesion properties may be temporarily affixed due to the difficulty of handling during fabrication.

(Textured Section)

The textured section 24b can be formed by printing, roughening, or etching the surface of the base film 20.

Examples of a printing include a gravure printing, a flexography, and so on. With respect to the printing ink used in printing, inclusion of an anti-blocking agent (e.g., polymer particles or the like) is preferable from the standpoint of easily formation of a texture on the printed section.

Examples of a roughening include a blast treatment and the like. In the case where the material of the base film 20 is polyimide, the roughening can also be conducted by alkali treatment or the like Examples of an etching include a wet etching, a dry etching (laser etching and the like), and so on.

The arithmetic mean roughness Ra of the textured section 24b is preferably from 0.3 to 3 μm. If the arithmetic mean roughness Ra of the textured section 24b is 0.3 μm or more, the vapor deposition film 28b formed on the textured section 24b is sufficiently thin, and the surface resistance of the vapor deposition film 28b is sufficiently high. If the arithmetic mean roughness Ra of the textured section 24b is 3 μm or less, the reduction in the strength of the base film 20 is mitigated.

The arithmetic mean roughness Ra means an arithmetic mean roughness according to the provisions of JIS (Japanese Industrial Standards) B0651: 1996.

Examples of the shape of the regions formed by the textured section 24b include a bar shaped, circular shape, hooked shape, spiral shape, and so on.

The maximum length per textured section 24b is preferably ¼ or less of the wavelength λ, of the electromagnetic wave noise to be shielded out by the vapor deposition film 28.

The area per textured section 24b is preferably from 0.1 to 40 mm$^2$, and more preferably from 0.25 to 20 mm$^2$, from the standpoint of the electromagnetic wave shielding function of the vapor deposition film 28.

It is preferable that the textured section 24b be repeatedly formed at prescribed pitches over the entire surface of the base film 20 so that the vapor deposition film 28 can uniformly shield out the electromagnetic wave noise.

The total area of the textured section 24b is preferably from 10 to 50% of the area of the vapor deposition film 28 (100%). When the total area of the textured section 24b is less than 10%, sufficient loss of the high-frequency current that runs through the vapor deposition film 28 cannot be achieved by the vapor deposition film 28b constituting the high-resistance section 22b. When the total area of the textured section 24b exceeds 50%, it is necessary to thicken the vapor deposition film 28 in order to maintain the electromagnetic wave shielding function.

(Non-Textured Section)

The non-textured section 24a (unprinted section, unroughened section, unetched section, and the like) is a surface to which printing, roughening, etching, and the like are not actively applied. The non-textured section 24a may be somewhat textured provided that their arithmetic mean roughness Ra is sufficiently smaller than that of the textured section 24b.

The arithmetic mean roughness Ra of the non-textured section 24a is preferably 0.1 μm or less. If the arithmetic mean roughness Ra of the non-textured section 24a is 0.1 μm or less, the vapor deposition film 28 to be formed on the non-textured section 24a will be thickened, and the surface resistance of the vapor deposition film 28a constituting the low-resistance section 22a will be sufficiently lowered.

(Soft Material Section)

The soft material section 26b is made of the soft material.

The soft material is a material that is softer than the material composing the surface 26a of the base film 20. Specifically, it is material with a hardness (Vickers hardness) lower than that of the surface 26a of the base film 20.

The hardness (Vickers hardness) of the soft material section 26b is preferably 500 or less from the standpoint of forming the vapor deposition film 28b constituting the high-resistance section 22b. The hardness (Vickers hardness) of the soft material section 26b is preferably 150 or more from the standpoint of form retention.

Examples of the soft material section 26b include the soft material section formed by printing using soft ink; the soft material section formed by printing using ink containing a soft filler such as particles or powder of elastic material or the like with small particle size; and so on. From the standpoint of ease of formation, the soft material section formed by printing using soft ink is preferable.

Examples of the printing method include the gravure printing method, the screen printing method, and so on.

Examples of the soft ink include a soft ink and the like using urethane resin, polyester resin, polyamide resin, epoxy resin, synthetic rubber or the like as binders.

Examples of the shape of the soft material section 26b include a bar shaped, circular shape, hooked shape, spiral shape, and so on. The maximum length per the soft material section 26b is preferably ¼ or less of the wavelength λ of the electromagnetic wave noise to be shielded out by the vapor deposition film 28.

The area per the soft material section 26b is preferably from 0.1 to 40 mm$^2$, and more preferably from 0.25 to 20 mm², from the standpoint of the electromagnetic wave shielding function of the vapor deposition film 28.

It is preferable that the soft material section 26b be repeatedly formed at prescribed pitches over the entire surface of the base film 20 so that the vapor deposition film 28 can uniformly shield out the electromagnetic wave noise.

The total area of the soft material section 26b is preferably from 10 to 50% of the area (100%) of the vapor deposition film 28. When the total area of the soft material section 26b is less than 10%, sufficient loss of the high-frequency current that runs through the vapor deposition film 28 cannot be achieved by the vapor deposition film 28b constituting the high-resistance section 22b. When the total area of the soft material section 26b exceeds 50%, it is necessary to thicken the vapor deposition film 28 in order to maintain the electromagnetic wave shielding function.

(Vapor Deposition Film)

The vapor deposition film 28 is a film composed of the conductive material formed by physical vapor deposition of the conductive material on the surface of the base film 20 and the surface of the textured section 24b or the soft material section 26b, and constitutes the electromagnetic wave shielding layer 22 in the electromagnetic wave shielding member.

The conductive material is a conductive material of the same type as the conductive material of the conductors of the printed wiring member. "Conductive material of the same type" signifies material whose primary composition is identical, and which enables etching using the same etching liquid as the etching liquid employed in etching the conductor.

Examples of the conductive material include a metal or a conductive ceramic. As the metal, gold, silver, copper, aluminum, or nickel is preferable, and copper is particularly preferable.

As the conductive material, use of conductive ceramic is also acceptable from the standpoint of enhancing environmental resistance. Examples of the conductive ceramic include an alloy, an intermetallic compound, a solid solution, and so on, which is composed of the metal and one or more elements selected from a group consisting of boron, carbon, nitrogen, silicon, phosphorous, and sulfur. Specific examples thereof include nickel nitride, titanium nitride, tantalum nitride, chromium nitride, titanium carbide, silicon carbide, chromium carbide, vanadium carbide, zirconium carbide, molybdenum carbide, tungsten carbide, chromium boride, molybdenum boride, chromium silicide, zirconium silicide, and so on.

Examples of the physical vapor deposition method include EB vapor deposition, ion beam vapor deposition, sputtering, and so on. The physical vapor deposition may be conducted with circulating gas for purposes of ceramicization.

From the standpoint of the electromagnetic wave shielding function that causes reflection of electromagnetic waves, the surface resistance of the vapor deposition film 28a (low-resistance section 22a) is preferably from 0.01 to 5Ω, and more preferably from 0.01 to 1Ω.

From the standpoint of causing sufficient loss of the high-frequency current that runs through the vapor deposition film 28, the surface resistance of the vapor deposition film 28b (high-resistance section 22b) is preferably from 2 to 100 times of the surface resistance of the vapor deposition film 28a.

From the standpoint of a flexural property, the thickness of the vapor deposition film 28 is preferably from 50 to 200 nm.

With respect to the transmission attenuation properties of the vapor-deposit film 28, −10 dB or less is preferable, and −20 dB or less is more preferable. Transmission attenuation properties can be measured, for example, in conformity with ASTM D4935 using a coaxial tube type shield effect measurement system (manufactured by KEYCOM Corp.) which measures the shielding effect with planar waves.

(Protective Layer)

The protective layer 32 is a layer which protects the vapor deposition film 28 from external contact, and is necessary in the case where the electromagnetic wave shielding member is used on the outermost layer of the printed wiring board.

The protective layer 32 is a layer composed of resin or rubber elastic material. The surface resistance of the protective layer 32 is preferably $1 \times 10^6 \Omega$ or more.

Examples of the protective layer 32 include a layer composed of film, coated film formed by application of paint, and so on. Examples of the material of the film include the same materials as that of the base film 20. The thickness of the protective layer 32 is preferably from 3 to 25 μm from the standpoint of flexibility.

<Insulating Adhesive Layer>

The insulating adhesive layer 30 is a layer which causes bonding of the electromagnetic wave shielding member and the printed wiring member.

As the insulating adhesive, it is preferable to use a semi-hardened adhesive that contains rubber components (e.g., carboxyl-modified nitrile rubber) for purposes of imparting flexibility to epoxy resin, thermoplastic polyimide, and the like. The insulating adhesive enters a fluid state by heating by hot pressing or the like, and exhibits adhesiveness by reactivation.

In order to prevent contact between the vapor deposition film 28 and the conductor of the printed wiring member resulting from the flow of the insulating adhesive, the insulating adhesive may also contain spacer particles (e.g., silicon oxide, titanium oxide, and magnesium hydroxide) with a particle size on the order of 1 to 10 μm, and the particles may have other functions such as fluidity regulation, fire retardancy, and so on.

In order to have the insulating adhesive enter a fluid state, and sufficiently filled itself among the conductor of the printed wiring member, the thickness of the insulating adhesive layer 30 is preferably from 5 to 40 μm, and more preferably from 10 to 20 μm.

<Printed Wiring Member>

The printed wiring member has the conductor on the surface of the insulating layer.

(Conductor)

The conductor is composed of the conductive material, and is the material which configures signal line paths, electric current line paths, electric current layers, ground line paths, ground layers, and the like.

The conductive material is conductive material of the same type as the conductive material of the electromagnetic wave shielding layer 22 (i.e., vapor deposition film 28) of the electromagnetic wave shielding member. "Conductive material of the same type" signifies material whose primary composition is identical, and which enables etching using the same etching liquid as the etching liquid employed in etching the electromagnetic wave shielding layer.

Example of the conductive material includes a copper foil. The copper foil is ordinarily used. Examples of the copper foil include an electrolytic copper foil, a rolled copper foil, and the like. The thickness of the copper foil is preferably from 3 to 50 μm.

(Insulating Layer)

Examples of the insulating layer include a layer composed of insulating film, a layer constituted by hardening of a hardening resin composition, and so on.

The surface resistance of the insulating film is preferably $1\times10^6\Omega$ or more.

The insulating film is preferably a film that has heat resistance, and more preferably a polyimide film, liquid crystal polymer film, or the like.

With respect to the thickness of the insulating film, from 5 to 50 μm is preferable, and from the standpoint of bendability, 6 to 25 μm is more preferable, and 10 to 25 μm is particularly preferable.

As the hardening resin, epoxy resin is ordinarily used.

The hardening resin composition containing the epoxy resin may also include as necessary alkoxy silane, hardeners, hardening accelerators, flexibility promoting agents, and the like.

The thickness of the layer constituted by hardening of the hardening resin composition is preferably from 0.1 to 10 μm.

Operational Effects

For the below-described reasons, the printed wiring board described above has an electromagnetic wave shielding function even without connecting the electromagnetic wave shielding layer (vapor deposition film) of the electromagnetic wave shielding member to a ground (ground line path, ground layer, etc.) of the printed member. Consequently, there is no need to impart conductivity to the adhesive layer for purposes of connecting the electromagnetic wave shielding layer to the ground, and bendability of the flexible printed wiring board is enhanced. In addition, as the adhesive layer does not have conductivity, there is no need for an insulating layer to provide insulation between the adhesive layer and the conductor of the printed wiring member, enabling achievement of a thinner flexible printed wiring board.

As there is no exposure of the electromagnetic wave shielding layer at the circumferential end faces of the printed wiring board, corrosion due to moisture and oxygen is suppressed. Consequently, the electromagnetic wave shielding function is highly reliable.

As the electromagnetic wave shielding layer is separated from the via hole or through hole of the printed wiring board, there is no short-circuiting of the electromagnetic wave shielding layer and the conductor at the via hole or through hole.

As the electromagnetic wave shielding layer and the conductor are made of the same type of conductive material, the electromagnetic wave shielding layer and the conductor can be etched with the same etching liquid during manufacture.

(Reason)

The reason that it is unnecessary to connect the electromagnetic wave shielding layer (vapor deposition film) to a ground is thought as follows.

The vapor deposition film 28a (i.e., low-resistance section 22a) of relatively low surface resistance formed on the surface of the base film 20 function as an antenna, because it is not connected to a ground. Consequently, electromagnetic wave noise that has not been fully reflected runs through the interior of the vapor deposition film 28a in the form of high-frequency current, and is re-radiated from the edge thereof. It is thought that when re-radiation occurs, fluctuations arise in the electromagnetic field at the edge of the vapor deposition film 28a, eddy currents accompanying the electromagnetic fluctuations therein flow into the vapor deposition film 28b (i.e., high-resistance sections 22b) of relatively high surface resistance, and heat loss occurs, thereby attenuating the energy of the electromagnetic wave noise.

Method of Manufacture of Printed Wiring Board

The method of manufacture of the printed wiring board of the present invention is a method having the following steps (I)-(III).

(I) A step in which conductor of the printed wiring member is etched to a desired shape using etching liquid.

(II) A step in which, using the same etching liquid as step (I), the electromagnetic wave shielding layer of the electromagnetic wave shielding member is etched to a desired shape, and to a size where the electromagnetic wave shielding layer is not exposed at the circumferential end faces of the printed wiring board in the printed wiring board obtained in step (III).

(III) A step in which trimming of the external form is conducted after the printed wiring member and the electromagnetic wave shielding member are bonded together with interposition of the insulating adhesive layer and with arrangement of the electromagnetic wave shielding layer in opposition so as to cover the object conductor.

(Step (I))

The film-like conductor provided over the entire surface of the insulating layer of the printed wiring member is etched by known methods, and worked into the shapes of signal line paths, electric current line paths, electric current layers, ground line paths, ground layers, and the like.

Examples of the etching liquid include common etching liquid may be used, and one may cite, for example, an aqueous solution whose primary component is copper chloride or ferric chloride.

(Step (II))

The film-like conductor of the electromagnetic wave shielding layer (vapor deposition film) provided over the entire surface of the base film of the electromagnetic wave shielding member is etched by known methods, and worked into the shapes required for electromagnetic wave shielding of the object conductor.

After trimming the external form of the printed wiring board in step (III), in order that the electromagnetic wave shielding layer is not exposed at the circumferential end face of the printed wiring board, the circumferential end on the outer side of the electromagnetic wave shielding layer is removed by etching along the border of the printed wiring board so that the outer circumferential end of the electromagnetic wave shielding layer terminate inside of the border of the printed wiring board.

Furthermore, in the case where the electromagnetic wave shielding member is used on the inner layer, the electromagnetic wave shielding layer of the portion where the via hole or through hole is formed and the periphery thereof (hereinafter, these are sometimes collectively referred to as the "anti-via portion") is removed by etching so that short-circuiting does not occur with the conductor of the via hole or through hole of the multilayer printed wiring board.

The anti-via portion can be formed by boring the electromagnetic wave shielding member, but as it may not be possible to conduct fine removal work, and as there may also be a risk of breakage due to weakening of the strength of the base film, it is preferable to conduct formation by etching that leaves the base film and that removes only the electromagnetic wave shielding layer.

As the conductive material of the electromagnetic wave shielding layer is of the same type as the conductive material of the conductor, there is no contamination of the etching liquid. Consequently, after etching of the conductor, the electromagnetic wave shielding layer can be etched using an etching device and an etching liquid identical to the etching liquid employed in etching of the conductor.

(Step (III))

The pre-member of the printed wiring member is obtained by bonding of the printed wiring member and the electromagnetic wave shielding member with interposition of the insulating adhesive layer and with arrangement of the electromagnetic wave shielding layer in opposition so as to cover the object conductor.

Examples of the method of providing the insulating adhesive layer include the method where a sheet-like insulating adhesive is affixed, the method where a liquid insulating adhesive is applied, and so on.

A via hole or through hole may be formed in the premember of the printed wiring member as necessary.

The printed wiring board is obtained by cutting off the superfluous portion at the circumferential edge of the printed wiring board precursor to trim the external form.

WORKING EXAMPLES

Working examples are shown below. The present invention is not limited by these working examples.

(Thickness of Each Layer)

Using a transmission electron microscope (H9000NAR, manufactured by Hitachi, Ltd.), a cross section was observed, and the thickness of each layer was measured at five spots, and averaged.

(Surface Resistance)

Using two thin-film metal electrodes (length: 10 mm, width: 5 mm, distance between electrodes: 10 mm) formed by vapor deposition of gold on vitreous silica, a measurement object was placed on top of the electrodes. Subsequently, a 50 g load was pressed upon a 10 mm×20 mm region of the measurement object from above the measurement object, and the resistance between electrodes was measured with measuring current of 1 mA or less, with this value considered as surface resistance.

(Hardness)

Vickers hardness was measured using a dynamic ultramicrohardness meter (DUH-211 manufactured by Shimadzu, Ltd.). The minimum push-in amount was set at 0.1 μm, and samples of submicron order thickness were also prepared for measurement.

(Evaluation of Electromagnetic Wave Shielding Function)

The electromagnetic wave shielding function of the electromagnetic wave shielding member was evaluated. Using the system shown in FIG. 6, electromagnetic wave noise (from 1 MHz to 2 GHz) transmitted from a shield loop antenna 74 (loop diameter: 8 mm, distance from loop center to a microstrip line 76: 10 mm) connected by coaxial cable to a tracking generator incorporating a spectrum analyzer 72 was received by the microstrip line 76 (Z: 50Ω, substrate size: 50 mm×80 mm, rear face: full-surface ground) with a line length of 55 mm, and reception properties were measured by the spectrum analyzer 72 in states where the microstrip line 76 was covered or not covered by the electromagnetic wave shielding member.

Working Example 1

The printed wiring board 1 having the structure shown in FIG. 1 (except that an electromagnetic wave shielding member 11 was used instead of the electromagnetic wave shielding member 10) was fabricated as follows.

A mask in which 1 mm×3 mm holes were formed at a pitch of 5 mm was applied to one surface of a 280 mm×280 mm×12.5 μm thickness polyimide film (arithmetic mean roughness Ra of base film 20: 0.08 μm), and blast treatment was carried out to form roughened sections (textured section 24b with an arithmetic mean roughness Ra of 1.6 μm) at positions corresponding to the holes.

A copper vapor deposition film (vapor deposition film 28) was formed by physically depositing copper by the magnetron sputtering method on the surface of the polyimide film on the side where the roughened sections were formed, obtaining the electromagnetic wave shielding member 11. The surface resistance of the vapor deposition film 28a formed in the non-textured section 24a was 0.5Ω, and the surface resistance of the vapor deposition film 28b formed in the textured section 24b was 1.8Ω.

A sample with the same size (50 mm×80 mm) as the microstrip substrate for electromagnetic wave shielding function evaluation was cut out from the electromagnetic wave shielding member 11.

Figure 6:
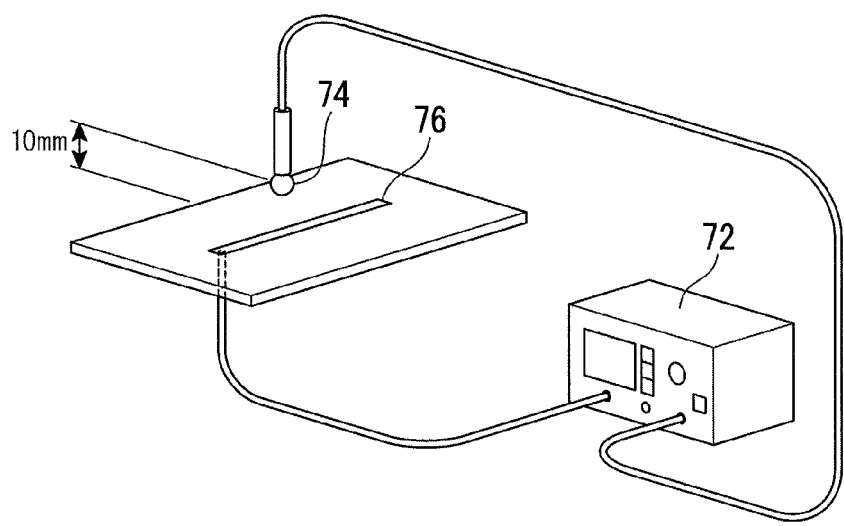
FIG. 6 is a block diagram which shows a system used in evaluating an electromagnetic wave shielding function.

The polyimide film side of the sample was pressed against the microstrip substrate shown in FIG. 6, and the microstrip line 76 was covered by electromagnetic wave shielding member 11. Reception properties were measured by outputting swept high-frequency signals ranging from 1 MHz to 2 GHz from the shield loop antenna 74. Reception properties were also measured in a state where the microstrip line 76 was not covered by the electromagnetic wave shielding member 12. Compared to the state where the microstrip line 76 was not covered with the electromagnetic wave shielding member 11, reception properties were attenuated on the order of from several dB to a maximum of 20 dB in the state where the microstrip line 76 was covered by the electromagnetic wave shielding member 11.

Subsequently, a resist film was affixed to the vapor deposition film 28 (i.e., the electromagnetic wave shielding layer 22) of the electromagnetic wave shielding member 11, exposure and development were conducted, and a resist pattern smaller than the external dimensions of the printed wiring board was formed with an anti-via portion. This was etched using an etching liquid of copper chloride identical to the etching liquid used to etch the conductor of the flexible printed wiring board. After resist peeling and cleaning, single-faced flexible printed wiring boards (the printed wiring member 40) were bonded to both sides of the electromagnetic wave shielding member 11 using the insulating adhesive layer 30. Boring centered on the anti-via portion was conducted, and the via hole 48 was formed. Furthermore, after the single-faced flexible printed wiring board (the printed wiring member 41) was bonded to the outermost layer, trimming of the external form was conducted to obtain the printed wiring board 1.

Adequate insulating properties were maintained between the via hole 48 and the electromagnetic wave shielding layer 22. The anti-via portion was filled by the insulating adhesive layer 30 without voids. The electromagnetic wave shielding layer 22 was not exposed at the circumferential end faces of the printed wiring board 1.

Working Example 2

The printed wiring board 2 having the structure shown in FIG. 2 was fabricated as follows.

Soft ink (Gaskamine 240 manufactured by Mitsubishi Gas Chemical Co. blended in an equal amount with an MEK solution of #1001 manufactured by Japan Epoxy Resins Co.) was printed using a gravure printer (GP-10 manufactured by Kurabo Industries, Ltd.) on one side of a 280 mm×280 mm×10 μm thickness polyimide film (the base film 20 with a surface hardness (Vickers hardness) of 560) which had been subjected to surface treatment for adhesion promotion, and 1 mm×3 mm the soft material section 26b (surface hardness (Vickers hardness): 260) or multiply formed at a pitch of 5 mm.

The vapor deposition film 28 was formed by physically depositing copper by the EB vapor deposition method on the surface of the soft material section 26b and the surface 26a of the polyimide film on the side where the soft material section 26b was formed to obtain the electromagnetic wave shielding member 12. The surface resistance of the vapor deposition film 28a formed on the surface 26a of the polyimide film was 0.24Ω, and the surface resistance of the vapor deposition film 28b formed on the surface of the soft material section 26b was 0.32Ω.

The reception properties of the electromagnetic wave shielding member 12 were measured in the same manner as working example 1. Compared to the state where the microstrip line 76 was not covered with the electromagnetic wave shielding member 12, reception properties were attenuated on the order of from several dB to a maximum of 35 dB in the state where the microstrip line 76 was covered by the electromagnetic wave shielding member 12.

Subsequently, a resist film was affixed to the vapor deposition film 28 (i.e., the electromagnetic wave shielding layer 22) of the electromagnetic wave shielding member 12, exposure and development were conducted, and a resist pattern smaller than the external dimensions of the printed wiring board was formed with an anti-via portion. This was etched using an etching liquid of copper chloride identical to the etching liquid used to etch the conductors of the flexible printed wiring board. After resist peeling and cleaning, a double-sided flexible printed wiring board (the printed wiring member 43) was bonded to one side of the electromagnetic wave shielding member 12 using the insulating adhesive layer 30. Furthermore, single-faced flexible wiring boards (the printed wiring member 40 and the printed wiring member 41) were bonded to the outermost layers. Boring centered on the anti-via portion was conducted to form the via hole 48, and trimming of the external form was conducted to obtain the printed wiring board 2.

Adequate insulating properties were maintained between the via hole 48 and the electromagnetic wave shielding layer 22. The anti-via portion was filled by the insulating adhesive layer 30 without voids. The electromagnetic wave shielding layer 22 was not exposed at the circumferential end face of the printed wiring board 2.

Comparative Example 1

Figure 7:
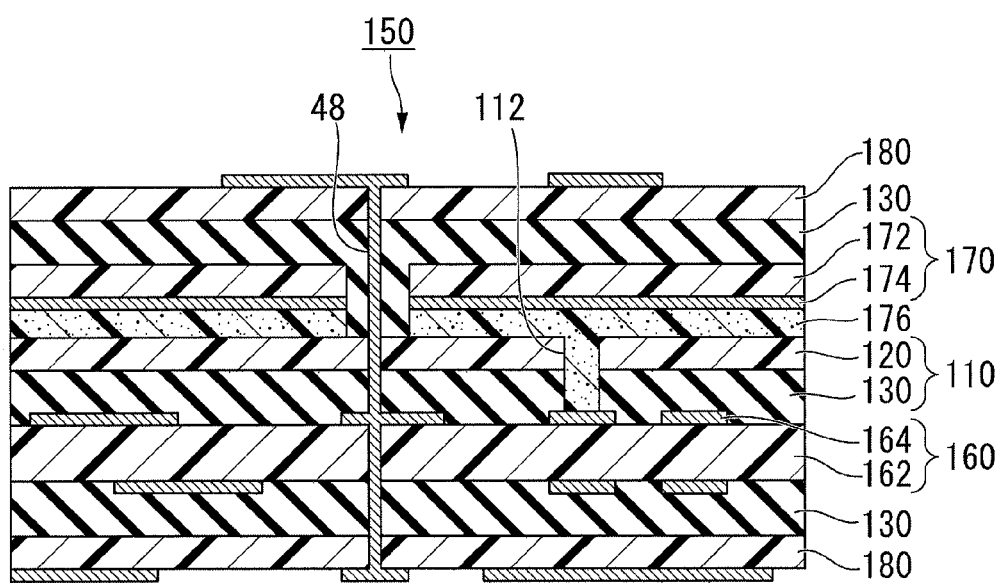
FIG. 7 is a cross-sectional view which shows an example of a conventional printed wiring board.

A flexible printed wiring board 150 having the structure shown in FIG. 7 was fabricated.

First, an insulating adhesive composed of nitrile rubber-modified epoxy resin was applied to the surface of a polyimide film 120 of 10 μm thickness so that dry film thickness was 20 μm, an insulating adhesive layer 130 was formed, and a coverlay film 110 was obtained. A through hole 112 was formed in the coverlay film 110 for purposes of earthing.

Subsequently, a flexible printed wiring board body 160 on which object conductor 164 was formed was prepared on the surface of the polyimide film 162 of 12 μm thickness.

The coverlay film 110 except for the terminal electrodes was affixed by hot pressing to the flexible printed wiring board body 160.

Aluminum was physically deposited by the ion beam vapor deposition method onto the surface of a polyphenylene sulfide film 172 of 3 μm thickness, an aluminum deposition film 174 of 100 nm thickness was formed, and an electromagnetic wave shielding film 170 was obtained.

Evaluation the electromagnetic wave shielding function was conducted in the same manner as working example 1, except that earthing was performed by having an earthed probe contact the aluminum deposition film 174 of the electromagnetic wave shielding film 170. The electromagnetic shield effect was identical to working example 2.

A resist pattern was formed on the aluminum deposition film 174 of the electromagnetic wave shielding film 170 in the same manner as working example 2. This was etched using an etching liquid of copper chloride of a device different from the etching liquid used to etch the conductor of the flexible printed wiring board.

Next, a conductive adhesive was prepared in which nickel particles with an average particle size of 10 μm were dispersed to 5 volume % in an insulating adhesive composed of nitrile rubber-modified epoxy resin.

The conductive adhesive was applied to the surface of the aluminum deposition film 174 so that dry film thickness was 12 μm, and the conductive adhesive layer 176 was formed. Thereafter, boring was conducted in the anti-via portion.

Next, the electromagnetic wave shielding film 170 was bonded to the coverlay film 110 side with interposition of the conductive adhesive layer 176. At this time, the aluminum deposition film 174 of the electromagnetic wave shielding film 170 on the coverlay film 110 side was earthed to a ground circuit through the conductive adhesive layer 176 in the through hole 112.

Furthermore, a single-faced flexible printed wiring board 180 was bonded to the outermost layers using the insulating adhesive layer 130, boring centered on the anti-via portion was conducted to form the via hole 48, and trimming of the external form was conducted to obtain the flexible printed wiring board 150.

Adequate insulating properties were maintained between the via hole 48 and the aluminum deposition film 174.

The anti-via portion was not fully filled by the insulating adhesive layer 130, and there were voids therein. The aluminum deposition film 174 was not exposed at the circumferential end faces of the flexible printed wiring board 150, but as aluminum was used as the vapor deposition film, it was necessary to separately prepare the etching device and the etching liquid, which was uneconomical.

INDUSTRIAL APPLICABILITY

As the printed wiring board of the present invention may be used as a flexible printed wiring board for optical modules, mobile phones, digital cameras, game devices, notebook computers, and electronic equipment such as medical instruments, it is extremely useful in industrial terms.

DESCRIPTION OF THE REFERENCE NUMERALS

1: printed wiring board
2: printed wiring board
10: electromagnetic wave shielding member
11: electromagnetic wave shielding member
12: electromagnetic wave shielding member
20: base film
22: electromagnetic wave shielding layer
22a: low-resistance section
22b: high-resistance section
24a: non-textured section
24b: textured section
26a: surface
26b: soft material section
28: vapor deposition film
28a: vapor deposition film
28b: vapor deposition film 30: insulating adhesive layer
40: printed wiring member
41: printed wiring member
42: insulating layer
43: printed wiring member
44: object conductor
48: via hole

The invention claimed is:

1. A printed wiring board, comprising:
    a printed wiring member which respectively has an object conductor that is subjected to electromagnetic wave shielding on at least one surface of an insulating layer; and
    an electromagnetic wave shielding member which has an electromagnetic wave shielding layer composed of a low-resistance section and a high-resistance section on at least one surface of a base film;
    wherein said printed wiring member and said electromagnetic wave shielding member are bonded together with interposition of an insulating adhesive layer, and with arrangement of said electromagnetic wave shielding layer separately and in opposition so that said object conductor is covered;
    said electromagnetic wave shielding layer and said object conductor are composed of the same type of conductive material; and
    said electromagnetic wave shielding layer is not exposed at a circumferential end face of said printed wiring board.

2. The printed wiring board according to claim 1, wherein said electromagnetic wave shielding layer is separated from a via hole or through hole of said printed wiring board.

3. The printed wiring board according to claim 1, wherein a surface resistance of said low-resistance section is from 0.01 to 5Ω, and a surface resistance of said high-resistance section is from 2 to 100 times of the surface resistance of said low-resistance section.

4. The printed wiring board according to claim 1, wherein said high-resistance section is repeatedly formed at intervals.

5. The printed wiring board according to claim 1, wherein said base film has a soft material section that is formed on parts of at least one surface of said base film and that is softer than the surface of said base film;
    said electromagnetic wave shielding layer is a vapor deposition film composed of conductive material formed on a surface of said base film on the side where said soft material section is formed;
    a vapor deposition film formed on the surface of said base film constitutes said low-resistance section; and
    a vapor deposition film formed on the surface of said soft material section constitutes said high-resistance section.

6. The printed wiring board according to claim 1, wherein said base film has a textured section and a non-textured section excluding said textured section which is formed on parts of at least one surface of said base film;
    said electromagnetic wave shielding layer is a vapor deposition film composed of conductive material formed on a surface of said base film on the side where said textured section is formed;
    a vapor deposition film formed on said non-textured section constitutes said low-resistance section; and
    a vapor deposition film formed on said textured section constitutes said high-resistance section.

7. A method of manufacture of the printed wiring board according to claim 1, comprising the following steps (I)-(III):
    (I) a step in which conductor of said printed wiring member is etched to desired shapes using etching liquid;
    (II) a step in which, using the same etching liquid as said step (I), the electromagnetic wave shielding layer of said electromagnetic wave shielding member is etched to a desired shape, and to a size where the electromagnetic wave shielding layer is not exposed at the circumferential end face of the printed wiring board in the printed wiring board obtained in the following step (III);
    (III) a step in which trimming of the external form is conducted, after said printed wiring member and said electromagnetic wave shielding member are bonded together with interposition of said insulating adhesive layer and with arrangement of said electromagnetic wave shielding layer in opposition so as to cover said object conductor.

* * * * *